(12) United States Patent
Song et al.

(10) Patent No.: US 7,253,703 B2
(45) Date of Patent: Aug. 7, 2007

(54) AIR-GAP TYPE FBAR, METHOD FOR FABRICATING THE SAME, AND FILTER AND DUPLEXER USING THE SAME

(75) Inventors: In-sang Song, Seoul (KR); Yun-kwon Park, Dongducheon-si (KR); Byeoung-ju Ha, Yongin-si (KR); Jun-sik Hwang, Ohsan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 36 days.

(21) Appl. No.: 10/959,313

(22) Filed: Oct. 7, 2004

(65) Prior Publication Data
US 2005/0128027 A1 Jun. 16, 2005

(30) Foreign Application Priority Data
Oct. 7, 2003 (KR) ............... 10-2003-0069543

(51) Int. Cl.
| H03H 9/54 | (2006.01) |
|---|---|
| H03H 9/70 | (2006.01) |
| H03H 9/10 | (2006.01) |
| H03H 9/15 | (2006.01) |
| H03H 3/02 | (2006.01) |

(52) U.S. Cl. ............... 333/133; 333/187; 333/189; 310/322; 310/324; 310/349; 29/25.35; 427/100

(58) Field of Classification Search ........ 333/187–189, 333/133; 310/324, 349; 427/100
See application file for complete search history.

(56) References Cited

U.S. PATENT DOCUMENTS 5,692,279 A * 12/1997 Mang et al. ............... 29/25.35
5,910,756 A * 6/1999 Ella ............................ 333/133
6,204,737 B1 * 3/2001 Ella ............................ 333/187
6,262,637 B1 * 7/2001 Bradley et al. ............. 333/133
6,472,954 B1 * 10/2002 Ruby et al. ................. 333/133
6,509,813 B2 * 1/2003 Ella et al. ................... 333/187
6,794,958 B2 * 9/2004 Philliber et al. ............ 333/189
2002/0109564 A1 * 8/2002 Tsai et al. ................... 333/187
2002/0121337 A1 * 9/2002 Whatmore et al. ......... 156/285

(Continued)

FOREIGN PATENT DOCUMENTS

FR 2 312 861 A1 12/1976

(Continued)

*Primary Examiner*—Barbara Summons
(74) *Attorney, Agent, or Firm*—Sughrue Mion, PLLC

(57) ABSTRACT

An air-gap type thin film bulk acoustic resonator (FBAR) and method for fabricating the same. Also disclosed are a filter and a duplexer employing the air-gap type FBAR. The air-gap type FBAR includes: a first substrate having a cavity part at a predetermined region on its upper surface; a dielectric film stacked on the upper part of the first substrate; a first air gap formed between the first substrate and the dielectric film; a stacked resonance part including a lower electrode/piezoelectric layer/upper electrode formed on the upper part of the dielectric film; a second substrate having a cavity part at a predetermined region on its lower surface and joined to the first substrate; and a second air gap formed between the stacked resonance part and the second substrate. A thin film of predetermined thickness made of a liquid crystal polymer (LCP) may be used as the dielectric film.

10 Claims, 4 Drawing Sheets

U.S. PATENT DOCUMENTS

2004/0029356 A1* 2/2004 Timme et al. ............... 438/455
2004/0257171 A1* 12/2004 Park et al. .................. 333/133
2005/0181572 A1* 8/2005 Verhoeven et al. ......... 438/379

FOREIGN PATENT DOCUMENTS

| JP | 63-82116 | * | 4/1988 | ................ 333/187 |
| JP | 07-084281 A | | 3/1995 | |
| JP | 9-64675 A | | 3/1997 | |
| JP | 2001-024476 A | | 1/2001 | |
| JP | 2002-164714 A | | 6/2002 | |
| JP | 2002-344280 A | | 11/2002 | |
| JP | 2003-179518 A | | 6/2003 | |
| KR | 2003-0039446 A | | 5/2003 | |
| KR | 2003-0057520 A | | 7/2003 | |
| WO | WO 02/05425 A1 | | 1/2002 | |

* cited by examiner (a)

(b)

(c)

(d)

(e)

US 7,253,703 B2

AIR-GAP TYPE FBAR, METHOD FOR FABRICATING THE SAME, AND FILTER AND DUPLEXER USING THE SAME

CROSS-REFERENCE TO RELATED APPLICATIONS

This application claims the benefit of Korean Patent Application No. 2003-69543 filed Oct. 7, 2003, in the Korean Intellectual Property Office, the disclosure of which is incorporated herein by reference.

BACKGROUND OF THE INVENTION

1. Field of the Invention

The present invention relates to a thin film bulk acoustic resonator (also referred to as "FBAR" hereinafter) for use in a filter and duplexer for communication in the RF (Radio Frequency) band. More particularly, the present invention relates to an air-gap type FBAR and method for fabricating the same, and a filter and a duplexer using the air-gap type FBAR, whose fabricating process is simplified and made more stable by using a LCP (Liquid Crystal Polymer) thin film.

2. Description of the Related Art

Recently, wireless mobile telecommunication technology has been rapidly advancing. Such mobile telecommunication technology requires a variety of RF parts capable of efficiently delivering information in a limited frequency band. Particularly, a filter among RF parts is essential for use in mobile telecommunication technology, which makes high-quality communication possible, by selecting a signal needed by a user among numerous broadcasting waves or by filtering a signal that is to be transmitted.

Currently, the RF filter most widely used for wireless communication is a dielectric filter and a surface acoustic wave (SAW) filter. The dielectric filter is advantageous in that it has high permittivity, low insertion loss, high temperature stability, and strongly resists inner vibration and inner impulse. The dielectric filer, however, has limitations in small-sizing and application to MMIC (Monolithic Microwave Integrated Circuit) which are recent trends in the technology development. On the other hand, the SAW filter is advantageous in that it is small-sized compared to the dielectric filter and signal processing is simple, the circuit is simple, and mass production is possible by using a semiconductor process. Also, the SAW filter is well adapted for outputting and inputting high-quality information, because rejection within the pass band is high as compared to the dielectric filter. The SAW filter, however, has a weak point in that IDT (Inter-Digital Transducer) line width is limited to 0.5 μm, because the process for exposing with an ultraviolet ray is included in the process for fabricating the SAW filter. Consequently, it is difficult to cover the extremely high frequency band (higher than 5 GHz) using the SAW filter and it is also difficult to construct a SAW filter together with a MMIC structure on a single chip of a semiconductor substrate.

To overcome such limitations and problems, FBAR capable of being completely integrated with MMIC together with other active elements on existing semiconductor substrates (e.g., Si, GaAs), has been proposed.

Since FBAR, which is a thin film element, is of low cost and small-sized and allows for a high quality coefficient, FBAR can be used for wireless communication in a variety of frequency bands (900 MHz~10 GHz) and radar for military use. Also, FBAR has properties such that small sizing is possible in a size of one to several hundredths that of a dielectric filter, and insertion loss is very small as compared to the SAW filter. Therefore, FBAR could be applied to a MMIC requiring high stability and a high quality coefficient.

FBAR having a stacked structure comprising an upper electrode/piezoelectric material/lower electrode is fabricated by a semiconductor process. A piezoelectric phenomenon is generated so that resonance may occur in a predetermined frequency band, and a volume wave is utilized. At the same moment, if the frequency of the volume wave becomes identical with the frequency of an input electric signal, a resonance phenomenon occurs. A resonator using such resonance phenomenon is realized in a FBAR filter through development of electric coupling, and further a duplexer using FBAR may also be realized.

In the meantime, FBAR structure has been studied in variety of ways to date. In case of a membrane type FBAR, silicon oxide film ($SiO_2$) is deposited on a substrate, and a membrane layer is formed on the opposite side of the substrate through a cavity part formed by isotropic etching. Next, a lower electrode is formed on the upper part of the silicon oxidation film, a piezoelectric material is deposited on the upper part of lower electrode by a RF magnetron sputtering method to form a piezoelectric layer, and an upper electrode is formed on the upper part of the piezoelectric layer.

The above described membrane type FBAR is advantageous in that dielectric loss of the substrate is low due to the cavity, and power loss is small. The membrane type FBAR, however, is problematic in that the size occupied by the element is large due to orientation of the silicon substrate. Also, yield decreases due to breakage upon subsequent packaging because structural stability is low. Therefore, to reduce loss by the membrane and to simplify the process for fabricating the element, an air-gap type and a bragg-reflector type FBAR have recently been proposed.

The bragg-reflector type FBAR is fabricated such that a material, whose elastic impedance difference is large, is deposited alternately on the substrate so that a reflecting layer is formed, and a lower electrode, a piezoelectric layer, and an upper electrode are sequentially stacked. According to the bragg-reflector type FBAR fabricated in this manner, elastic energy that has passed through the piezoelectric layer cannot be delivered in the substrate direction but is completely reflected at the reflecting layer, whereby efficient resonance is potentially generated. Such bragg-reflector type FBAR is advantageous in that it has a solid structure and there is no stress due to bending, but is disadvantageous in that it is difficult to form the reflecting layer of more than four layers whose thickness is accurate for total reflection, and much time and cost are required for its fabrication.

On the other hand, a conventional air-gap type FBAR having a structure in which the substrate is separated from the resonance part using an air gap instead of a reflecting layer, realizes FBAR by forming a sacrificial layer 110 by isotropic etching of the surface of the silicon substrate 100, surface polishing using CMP (Chemical Mechanical Planarization), then sequentially depositing an insulating film 120, a stacked structure 130 including a lower electrode 133, a piezoelectric layer 135, and an upper electrode 137, removing the sacrificial layer 110 through a via hole, and forming an air gap 140 as shown in FIG. 1. A second substrate 150 having a cavity part 160 in its lower surface is then joined to the silicon substrate 100.

However, the method for fabricating FBAR according to the conventional art requires a CMP process, thereby increasing complexity in terms of the process and increasing cost. Also, wet etching is used for forming the air gap in the method of the conventional art, and in that case, it is difficult to remove the etching solution. If the etching solution is not completely removed, the element is deteriorated due to constant action of the etching solution, thereby causing a change in resonance frequency. On the other hand, in the case of dry etching, physical impulse is exerted on the element by ions and molecules in a plasma state using existing plasma dry etching techniques, and the element is deteriorated due to high temperature.

SUMMARY OF THE INVENTION

Accordingly, the present invention has been achieved to solve the above-mentioned problems occurring in the conventional art, and an object of the present invention is to realize simple and solid FBAR capable of reducing impulse exerted on the element when subjected to existing dry etch processing and reducing the number of processing steps and processing errors. More particularly, the present invention has been achieved by stacking a liquid crystal polymer thin film on a silicon substrate having a cavity part, and forming an air gap without the need for a CMP process and without the need for removing a sacrificial layer. Also, with use of the air-gap type FBAR according to the above-described method, a filter and a duplexer can be realized.

The foregoing and other objects and advantages are achieved by providing an air-gap type FBAR, which comprises: a first substrate having a cavity part at a predetermined region on its upper surface; a dielectric film stacked on an upper part of the first substrate, thereby forming a first air gap on the cavity part of the first substrate; a stacked resonance part comprising a lower electrode/piezoelectric layer/upper electrode formed on an upper part of the dielectric film; and a second substrate having a cavity part at a predetermined region on its lower surface and joined to the first substrate.

The dielectric film may be formed from a thin film of a liquid crystal polymer (LCP) of predetermined thickness, or by etching a thin film of a liquid crystal polymer (LCP) to a predetermined thickness. Also, the dielectric film may be formed by partially etching the thin film formed by the liquid crystal polymer (LCD) to a predetermined thickness only in a predetermined region that corresponds to the first air gap.

The foregoing and other objects and advantages are also achieved by providing a method for fabricating an air-gap type FBAR according to the present invention, which comprises the steps of: forming a first air gap by stacking a dielectric film on a first substrate having a cavity part on a predetermined region on its upper surface; forming a stacked resonance part on an upper surface of the dielectric film layer; and forming a second air gap by joining the first substrate and a second substrate having a cavity part at a predetermined region on its lower surface.

The step of forming the stacked resonance part further comprises the steps of: depositing a lower electrode on a predetermined region of an upper surface of the dielectric film; depositing a piezoelectric layer on an upper surface of the lower electrode that corresponds to the cavity part of the first substrate; and depositing an upper electrode on an upper surface of the piezoelectric layer and an upper surface of a predetermined region of the dielectric film where the lower electrode is not deposited.

Preferably, in the step of forming the first air gap, a thin film of predetermined thickness formed by the liquid crystal polymer (LCP) serves as the dielectric film.

The foregoing and other objects and advantages are also achieved by providing an air-gap type FBAR filter of the present invention, which comprises: a first resonance part consisting of a plurality of series-connected FBARs having a first resonance frequency; a second resonance part consisting of a plurality of FBARs having a second resonance frequency and connected in parallel to a plurality of the FBARs of the first resonance part; and a plurality of inductors connected in series to a plurality of the FBARs constituting the second resonance part, respectively, in which: the FBARs constituting the first and the second resonance parts each comprises a dielectric film stacked on the upper part of a first substrate having a plurality of cavity parts on its upper surface; a first air gap formed between the first substrate and the dielectric film; and a stacked resonance part comprising a lower electrode/piezoelectric layer/upper electrode formed on the upper part of the dielectric film layer.

Here, a thin film of predetermined thickness formed by a liquid crystal polymer (LCP) serves as the dielectric film.

The foregoing and other objects and advantages are also achieved by providing an air-gap type FBAR duplexer of the present invention, which comprises: a first FBAR filter for transmitting a signal provided to a transmission terminal through an antenna; a second FBAR filter for receiving a signal from the antenna to be input to a reception terminal; and a phase shift part arranged between the antenna and the second filter, for preventing interference of a signal at the first and the second filters by changing a phase of a signal transmitted and received, wherein the first and the second filters have, respectively, first and second resonance parts having different predetermined resonance frequencies, and a plurality of FBARs formed on the first and the second resonance parts each including a dielectric film stacked on the upper part of the first substrate having a plurality of cavity parts on its upper surface; a first air gap formed between the first substrate and the dielectric film; and a stacked resonance part comprising a lower electrode/piezoelectric layer/upper electrode formed on an upper part of the dielectric film layer.

BRIEF DESCRIPTION OF THE DRAWINGS

The above objects and other advantages of the present invention will be more apparent from the following detailed description when taken in conjunction with the accompanying drawings, in which.

DETAILED DESCRIPTION OF THE PREFERRED EMBODIMENTS

Figure 1:
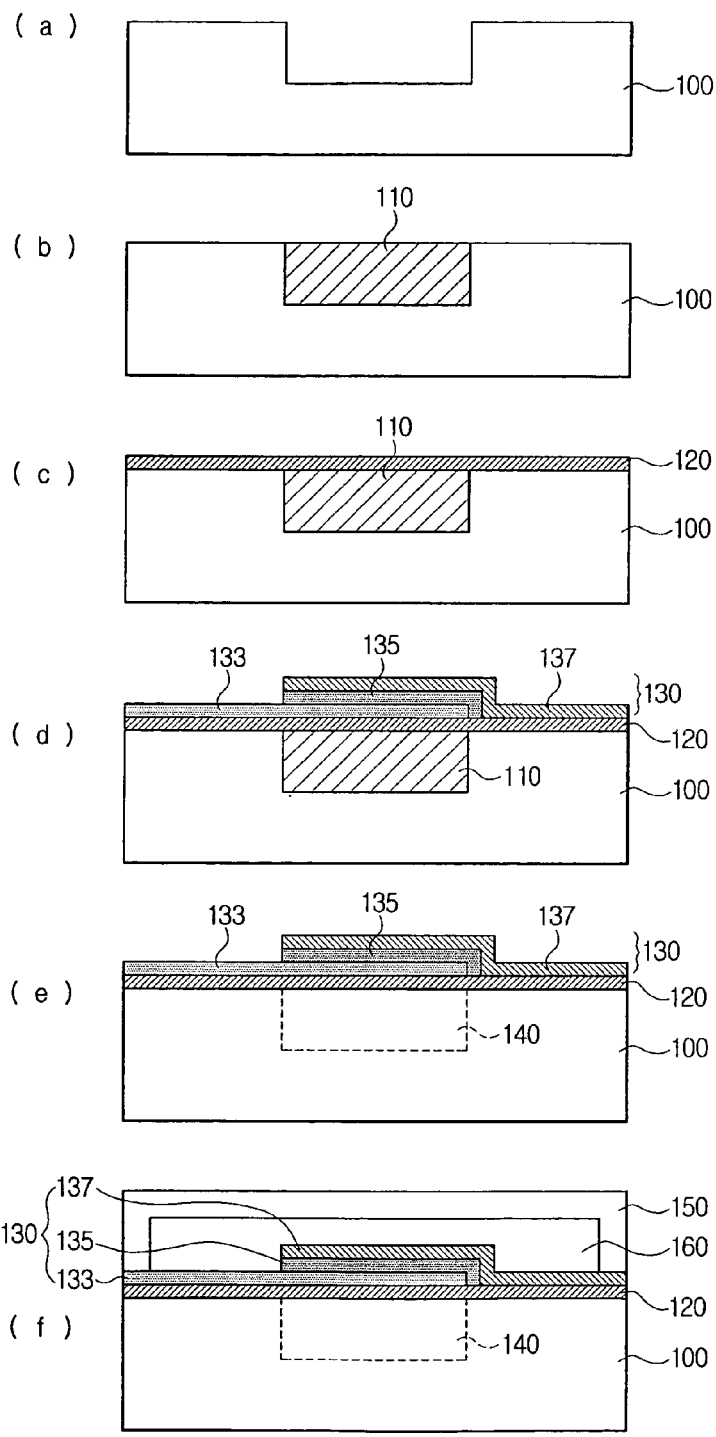
FIGS. 1(a)–(f) are views showing a process at each step in the method for fabricating an air-gap type FBAR according to the conventional art.

FBAR and the method for fabricating the same according to the present invention will now be described with reference to the accompanying drawings. However, the present invention should not be construed as being limited thereto.

FIGS. 2(a)–(e) are cross-sectional views showing, step by step, the method for fabricating the airgap type FBAR according to the present invention. The air-gap type FBAR of the present invention comprises: a first substrate 200; a first air gap 210; a dielectric film 220; a stacked resonance part 230; a second substrate 240; and a second air gap 250.

Figure 2:
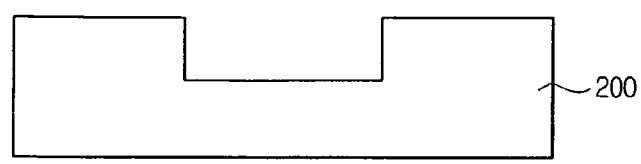
FIGS. 2(a)–(e) are views showing a process at each step in the method for fabricating an air-gap type FBAR according to an embodiment of the present invention.
Figure 2:
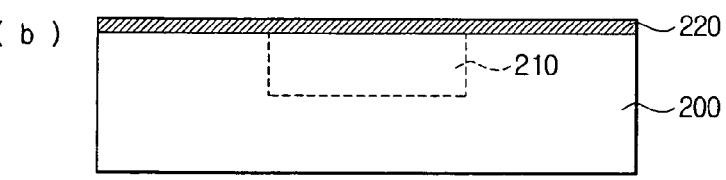
Figure 2:
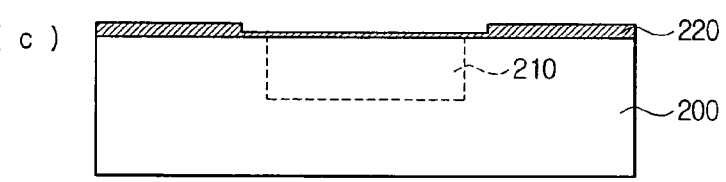
Figure 2:
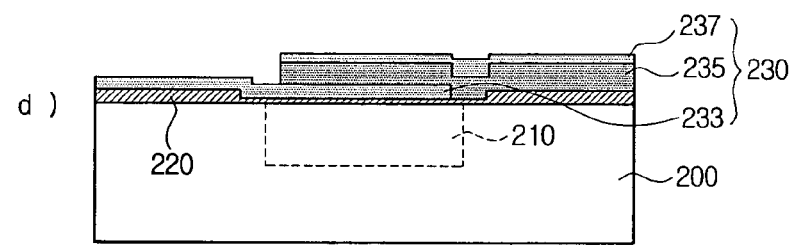
Figure 2:
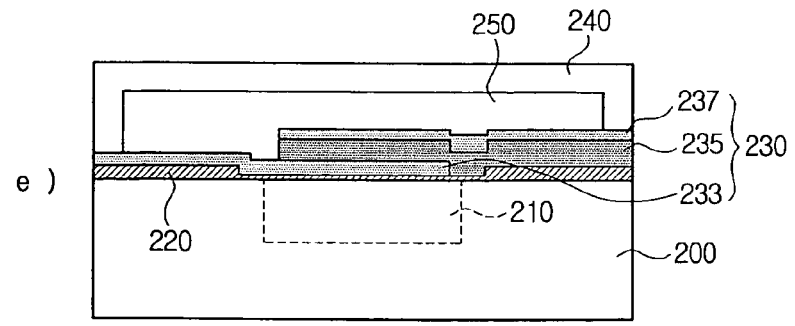

In the first instance, the first substrate 200 having a cavity part may be formed by isotropic etching of a predetermined region on the upper surface of a silicon substrate, i.e., the region that corresponds to the stacked resonance part 230, to a depth of 2~3 μm (as shown in FIG. 2(a)).

The first air gap 210 is realized by stacking a dielectric film layer 220 of predetermined thickness on the first substrate 200. Here, the dielectric film 220 supports the stacked resonance part 230 and functions as an insulating layer. For such dielectric film 220, a thin film made of a polymer such as LCP (Liquid Crystal Polymer) is used (as shown in FIG. 2(b)). In that case, the LCP thin film is used after polishing to a thickness of about 1 μm, or a film of a thickness of about 1 μm may be employed as a starting material. Alternatively, after a LCP thin film having a thickness of 5 μm is stacked on the first substrate, a photoresist is deposited in a thickness of 5~10 μm and the portion that corresponds to the first air gap may be etched to a thickness of about 1 μm and then used (as shown in FIG. 2(c)). In the present invention, the dielectric film layer on which the photoresist is not deposited is etched by means of dry etching.

The stacked resonance part 230, which is formed on the dielectric film layer 220, is realized by sequentially depositing a lower electrode 233, a piezoelectric layer 235, and an upper electrode 237, on a predetermined region including the portion that corresponds to the first air gap (as shown in FIG. 2(d)). If an external signal is applied between the two electrodes, part of the electric energy delivered between the two electrodes is converted to mechanical energy due to the piezoelectric effect. During the process for converting such mechanical energy to electric energy, resonance occurs with respect to a frequency of proper vibration depending on the thickness of the piezoelectric layer 235. It is also possible to obtain a different resonance frequency by changing the thickness of the LCP thin film.

In case of depositing the lower electrode 233, since the substrate is separated and resonance efficiency is good if and only if the first air gap 210 is positioned under the stacked resonance part 230 where the resonance directly occurs at one end of the dielectric film layer 220, the lower electrode should be patterned to extend over the upper layer of the first air gap 210. The material for the lower electrode is generally a conductive material such as a metal, and preferably, one among Al, W, Au, Pt, Ni, Ti, Cr, Pd and Mo may be selected and used.

The next step is to deposit the piezoelectric layer 235 on a predetermined region of the lower electrode 233 and the dielectric film layer 220. Aluminum nitride (AlN) or zinc oxide (ZnO) is generally used for the piezoelectric material, but the piezoelectric material is not restricted to these materials. One among a RF magnetron sputtering method and a evaporation method may be used for depositing the piezoelectric materials. After the piezoelectric layer is deposited on the lower electrode 233, the piezoelectric layer 235 should be patterned to extend over the upper layer of the portion where the air gap 210 is positioned on its lower part as in the case of the lower electrode 233.

The next step is to deposit the upper electrode 237 on the piezoelectric layer 235 and the dielectric film 220. Regarding the upper electrode 237, it may be possible to use the same material, the same depositing method, and the same patterning method as in the case of the lower electrode 233.

Then, after the second substrate 240 having a cavity part on its predetermined region is joined to the first substrate 200 where the stacked resonance part is formed as shown in FIG. 2(e), a plurality of via holes for connecting with a signal from the outside are formed.

With the air-gap type FBAR manufactured in the foregoing manner, it is possible to realize an FBAR filter by making a circuit in a trapezoidal shape from a serial FBAR and a parallel FBAR. The bandpass of the filter is determined by the resonance characteristics of each FBAR constituting the circuit.

The FBAR comprises: a first resonance part consisting of a plurality of series connected FBARs having a first resonance frequency; a second resonance part having a second resonance frequency and consisting of a plurality of FBARs connected in parallel to a plurality of the FBARs of the first resonance part; and a plurality of inductors, each of which is connected in series to a plurality of the FBARs constituting the second resonance part.

Figure 3:
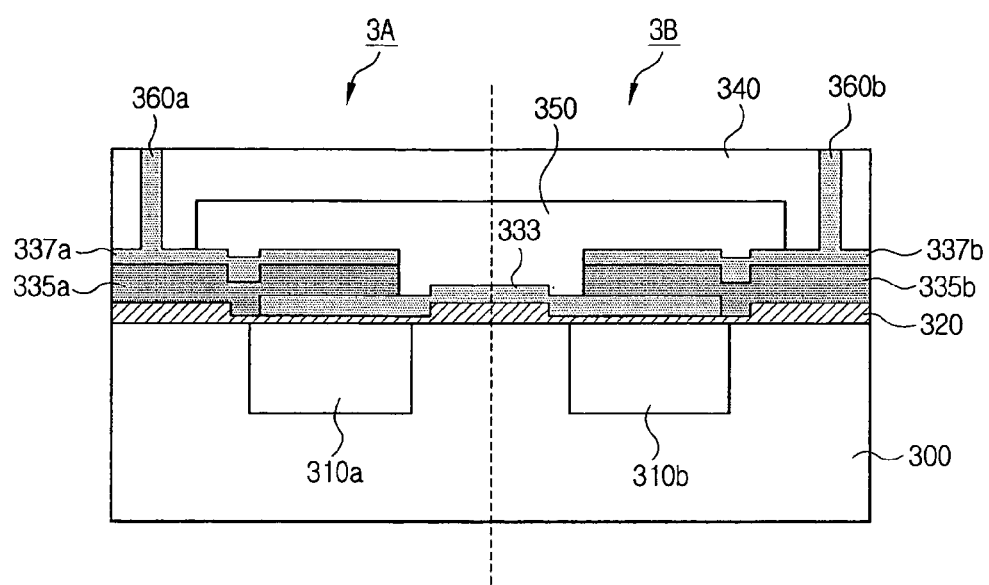
FIG. 3 is a view showing the structure of the filter using the air-gap type FBAR according to the present invention.

FIG. 3 is a cross-sectional view of the first resonance part 3A and the second resonance part 3B of the air-gap type FBAR filter according to the present invention. It is possible to realize the filter of the present invention by stacking a LCP thin film 320 on a substrate 300 having a plurality of cavities to form a first air gap 310a and 310b; next sequentially depositing a lower electrode 333/piezoelectric layer 335a and 335b/upper electrode 337a and 337b, on the upper part of a dielectric film layer 320 to form a stacked resonance part; joining a second substrate 340 having a cavity part 350, to the upper part of the first substrate; and forming via holes 360a and 360b for connecting with an external signal.

Figure 4:
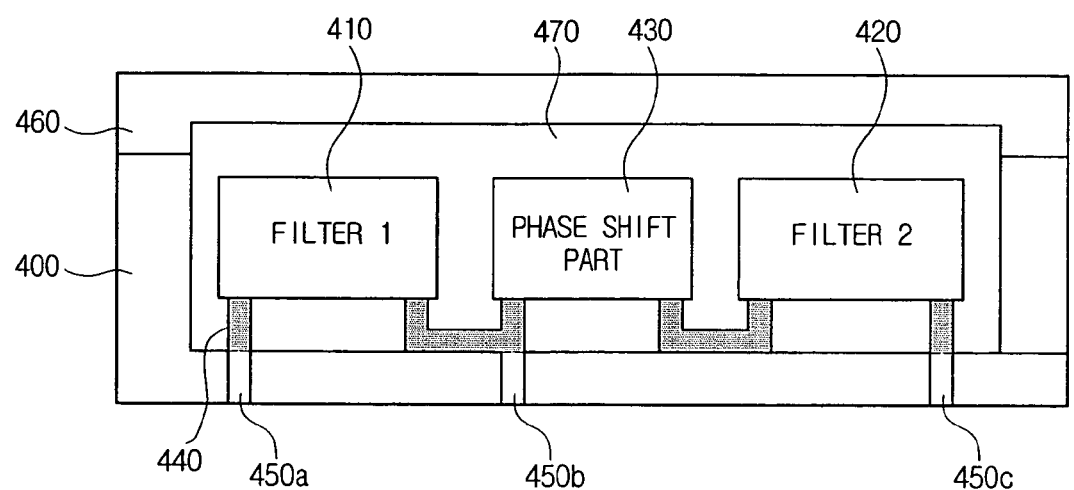
FIG. 4 is a view schematically showing the structure of a duplexer using the air-gap type FBAR according to the present invention.

FIG. 4 is a schematic, structural view showing the air-gap type FBAR duplexer according to the present invention. In the drawing, the basic structure of the FBAR duplexer for properly branching signals transmitted and received through a single antenna connected to the terminal 450b generally comprises: a transmission terminal filter 410; a reception terminal filter 420; and a phase shift part 430. Here, the transmission terminal filter 410 and the reception terminal filter 420 are band pass filters for passing only the frequency that is to be transmitted and received, respectively. Since the difference in the frequencies of the signals transmitted and received through such transmission and reception terminal filters 410 and 420 is small and the signals sensitively react to mutual interference between those signals, the phase shift part 430 is required for preventing such mutual interference by isolating the transmission and reception terminal filters 410 and 420. Generally, the phase shift part 430 prevents mutual interference by using a capacitor and an inductor to impart a phase difference, which may become 90 degrees, between the transmitted and received signals.

The air-gap type FBAR according to the present invention is advantageous in that fabrication is simple and the time consumed for fabrication is short. This is because the number of processing steps and therefore processing errors are reduced. Also, improved resonance characteristics are expected, compared to the existing method for fabricating the FBAR. Also, it is possible to realize a FBAR filter and duplexer whose characteristics are improved and having a simplified process, using the air-gap type FBAR fabricated according to the present invention.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An air-gap type FBAR (Film Bulk Acoustic Resonator) comprising:
   a first substrate having a cavity part at a predetermined region on its upper surface;
   a dielectric film stacked on an upper part of the first substrate, forming a first air gap on the cavity part of the first substrate;
   a stacked resonance part comprising a lower electrode/piezoelectric layer/upper electrode formed on an upper part of the dielectric film; and
   a second substrate having a cavity part at a predetermined region on its lower surface and joined to the first substrate,
   wherein the dielectric film comprises a liquid crystal polymer (LCP) film of predetermined thickness.

2. The FBAR as claimed in claim 1, wherein the LCP film has been partially etched to the predetermined thickness only in a region corresponding to the first air gap.

3. The FBAR as claimed in claim 1, wherein the LCP film has been etched to the predetermined thickness.

4. An air-gap type FBAR (Film Bulk Acoustic Resonator) filter comprising:
   a first resonance part comprising a plurality of series-connected FBARs having a first resonance frequency;
   a second resonance part comprising a plurality of FBARs having a second resonance frequency and connected in parallel to a plurality of the FBARs of the first resonance part; and
   a plurality of inductors connected in series to a plurality of the FBARs constituting the second resonance part, respectively,
   wherein the FBARs constituting the first and the second resonance parts each comprises: a dielectric film stacked on an upper part of a first substrate, forming a first air gap on the upper part of the first substrate having a plurality of cavity parts on its upper surface; and a stacked resonance part comprising a lower electrode/piezoelectric layer/upper electrode formed on an upper part of the dielectric film layer,
   wherein the dielectric film comprises a liquid crystal polymer (LCP) film of predetermined thickness.

5. A method for fabricating an air-gap type FBAR (Film Bulk Acoustic Resonator) which comprises:
   forming a first air gap by directly forming a dielectric film directly on a first substrate having a cavity part, without using a sacrificial layer, on a predetermined region on its upper surface;
   forming a stacked resonance part on an upper surface of the dielectric film; and
   forming a second air gap by joining the first substrate and a second substrate having a cavity part at a predetermined region on its lower surface.

6. The method as claimed in claim 5, wherein the step of forming the stacked resonance part further comprises:
   depositing a lower electrode on a predetermined region of an upper surface of the dielectric film;
   depositing a piezoelectric layer on an upper surface of the lower electrode corresponding to the cavity part of the first substrate; and
   depositing an upper electrode on an upper surface of the piezoelectric layer and an upper surface of a predetermined region of the dielectric film where the lower electrode is not deposited.

7. A method for fabricating an air-gap type FBAR (Film Bulk Acoustic Resonator) which comprises:
   forming a first air gap by stacking a dielectric film on a first substrate having a cavity part on a predetermined region on its upper surface;
   forming a stacked resonance part on an upper surface of the dielectric film; and
   forming a second air gap by joining the first substrate and a second substrate having a cavity part at a predetermined region on its lower surface,
   wherein at the step of forming the first air gap, said method comprises forming a dielectric film of predetermined thickness from a liquid crystal polymer (LCP).

8. A method for fabricating an air-gap type FBAR (Film Bulk Acoustic Resonator) which comprises:
   forming a first air gap by stacking a dielectric film on a first substrate having a cavity part on a predetermined region on its upper surface;
   forming a stacked resonance part on an upper surface of the dielectric film; and
   forming a second air gap by joining the first substrate and a second substrate having a cavity part at a predetermined region on its lower surface,
   wherein the dielectric film comprises a liquid crystal polymer (LCP) film of predetermined thickness.

9. The method as claimed in claim 8, wherein the step of forming the stacked resonance part further comprises:
   depositing a lower electrode on a predetermined region of an upper surface of the dielectric film;
   depositing a piezoelectric layer on an upper surface of the lower electrode corresponding to the cavity part of the first substrate; and
   depositing an upper electrode on an upper surface of the piezoelectric layer and an upper surface of a predetermined region of the dielectric film where the lower electrode is not deposited.

10. An air-gap type FBAR (Film Bulk Acoustic Resonator) duplexer comprising:
    a first FBAR filter for transmitting a signal provided to a transmission terminal through an antenna;
    a second FBAR filter for receiving a signal from the antenna to be input to a reception terminal; and
    a phase shift part arranged between the antenna and the second filter, for preventing interference of a signal at the first and the second filters by changing a phase of a signal transmitted and received,
    wherein the first and the second filters have, respectively, first and second resonance parts having different predetermined resonance frequencies, and a plurality of FBARs formed on the first and the second resonance parts each including a dielectric film stacked on an upper part of a first substrate, thereby forming a first air gap on the upper part of the first substrate having a plurality of cavity parts on its upper surface; and a stacked resonance part comprising a lower electrode/piezoelectric layer/upper electrode formed on the upper part of the dielectric film, and
    wherein the dielectric film comprises a liquid crystal polymer (LCP) film of predetermined thickness.

* * * * *